(12) United States Patent
Sato

(10) Patent No.: US 11,264,247 B2
(45) Date of Patent: Mar. 1, 2022

(54) METHOD FOR FORMING ETCHING MASK AND METHOD FOR MANUFACTURING SEMICONDUCTOR DEVICE

(71) Applicant: KIOXIA CORPORATION, Tokyo (JP)

(72) Inventor: Hironobu Sato, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 16/997,729

(22) Filed: Aug. 19, 2020

(65) Prior Publication Data

US 2021/0074549 A1 Mar. 11, 2021

(30) Foreign Application Priority Data

Sep. 10, 2019 (JP) .............................. JP2019-164956

(51) Int. Cl.
| | | |
|---|---|---|
| *H01L 21/308* | (2006.01) | |
| *H01L 21/67* | (2006.01) | |
| *H01L 21/027* | (2006.01) | |
| *G03F 7/20* | (2006.01) | |

(52) U.S. Cl.
CPC ...... *H01L 21/3081* (2013.01); *H01L 21/0274* (2013.01); *H01L 21/67063* (2013.01); *G03F 7/2004* (2013.01)

(58) Field of Classification Search
CPC ..... G03F 7/2004; G03F 7/40; H01L 21/0274; H01L 21/0337; H01L 21/3081; H01L 21/31058; H01L 21/31144; H01L 21/67063

USPC ....... 438/689, 706, 712, 713, 714, 717, 723, 438/725, 770
See application file for complete search history.

(56) References Cited

U.S. PATENT DOCUMENTS

| | | | |
|---|---|---|---|
| 9,171,716 B2 | 10/2015 | Fukuda | |
| 9,996,004 B2 | 6/2018 | Smith et al. | |
| 2012/0241411 A1* | 9/2012 | Darling | H01L 21/0274 216/67 |
| 2015/0255298 A1* | 9/2015 | Darling | H01L 21/0274 438/703 |
| 2020/0075319 A1* | 3/2020 | Chang | H01L 21/76877 |

FOREIGN PATENT DOCUMENTS

| | | |
|---|---|---|
| JP | 5559065 B2 | 7/2014 |
| WO | 2009105347 A2 | 8/2009 |

* cited by examiner

*Primary Examiner* — Lan Vinh
(74) *Attorney, Agent, or Firm* — Kim & Stewart LLP

(57) ABSTRACT

According to one or more embodiments, a method for forming an etching mask includes forming a mask layer including a first organic material on a processing object, processing the mask layer to form a pattern including an opening, exposing the mask layer to a first oxidizing gas containing a first metal material such that the first metal material penetrates into the mask layer, and then exposing the mask layer to a first oxidizing gas including hydrogen peroxide or ozone to oxidize the first metal material.

20 Claims, 14 Drawing Sheets

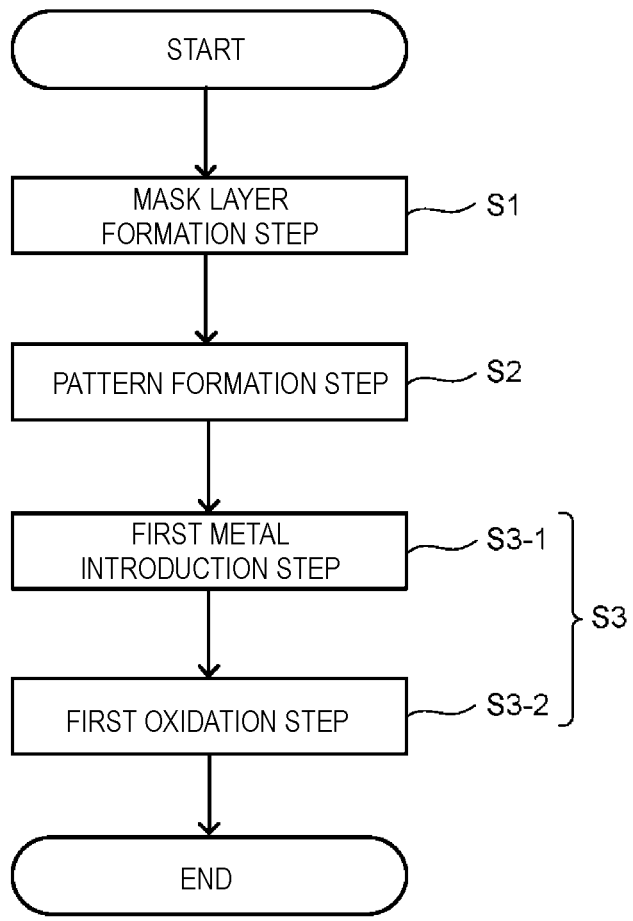
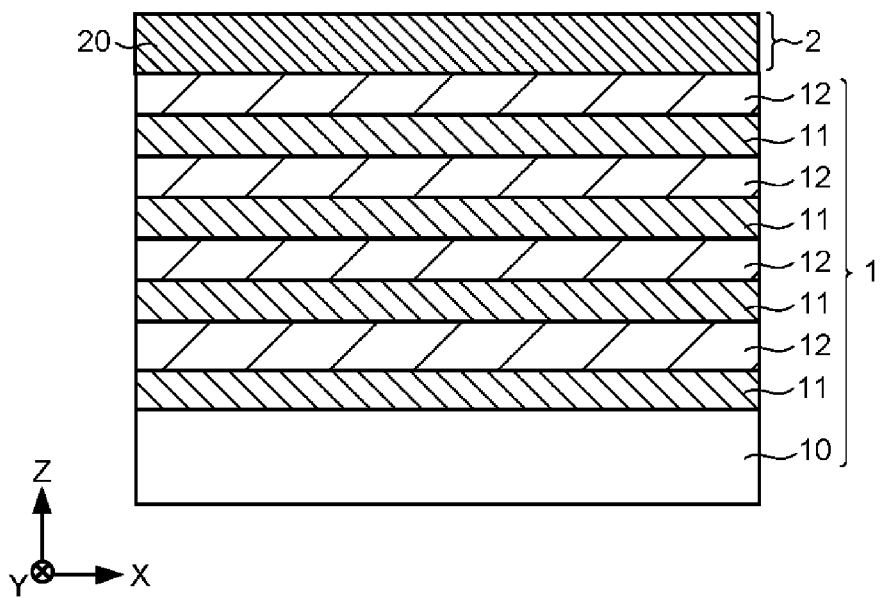

METHOD FOR FORMING ETCHING MASK AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2019-164956, filed Sep. 10, 2019, the entire contents of which are incorporated herein by reference.

FIELD

Embodiments described herein relate generally to a method for forming an etching mask and a method for manufacturing a semiconductor device.

BACKGROUND

A technique of etching a processing workpiece (that is an object being subjected to or to be subjected to various processing steps, such as a semiconductor substrate) by utilizing a hard mask including a metal oxide as an etching mask is known as a method of manufacturing a semiconductor device such as a three-dimensional memory.

DESCRIPTION OF THE DRAWINGS

FIG. 1 is a flow chart of a method for forming an etching mask according to an embodiment.

FIG. 2 depicts a mask layer formed on a processing workpiece in a schematic cross-sectional view according to an embodiment.

DETAILED DESCRIPTION

Figure 3:
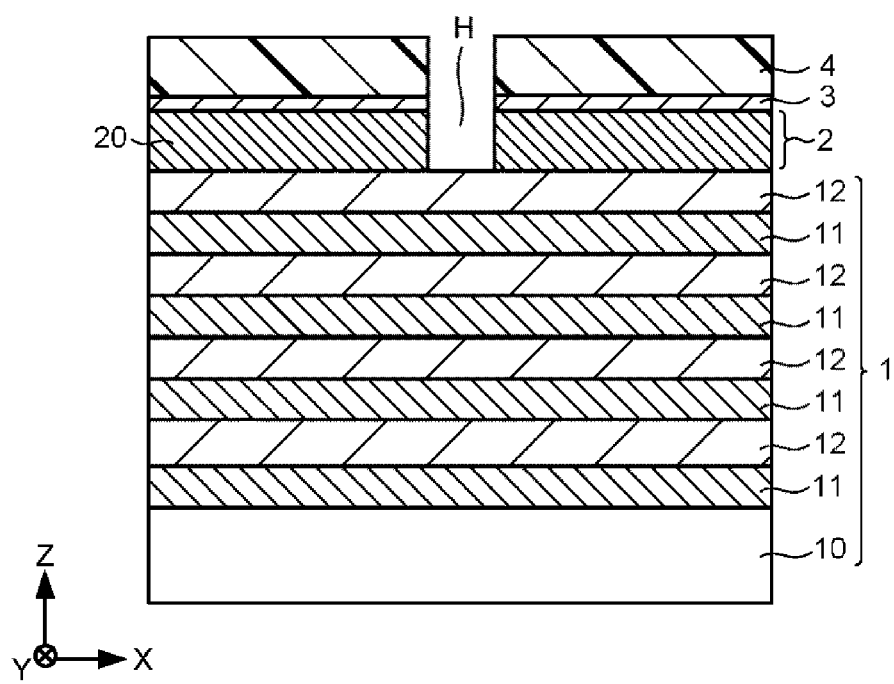
FIG. 3 depicts a mask layer with a mask pattern formed therein in a schematic cross-sectional view according to an embodiment.

According to one or more embodiments, a method for forming an etching mask includes: forming a mask layer including a first organic material on a processing workpiece, processing the mask layer to form a pattern including an opening, exposing the mask layer to a first gas containing a first metal material such that the first metal material penetrates into the mask layer, and exposing the mask layer to a first oxidizing gas including hydrogen peroxide or ozone to oxidize the first metal material.

Embodiments of the present disclosure will now be described with reference to the drawings. In the drawings, the relationship between the thickness and the plane dimensions of a component or element, the thickness ratio between components or elements, etc. are not necessarily to scale. In the drawings and in the following description, the same symbols are used for components or elements having substantially the same configuration, and descriptions thereof will sometimes be omitted.

First Embodiment

FIG. 1 is a flow chart illustrating an example of a method for forming an etching mask which is a hard mask according to a first embodiment. As shown in FIG. 1, the etching mask forming method according to the first embodiment includes a mask layer formation step (S1), a pattern formation step (S2) and a metallization step (S3).

[Mask Layer Formation Step]

FIG. 2 is a schematic cross-sectional view illustrating an example of the mask layer formation step (S1) and shows part of a processing workpiece 1 (that is an object being or to be subjected to processing) in an X-Z cross-section containing an X-axis and a Z-axis perpendicular to a Y-axis which is perpendicular to the X-axis. As shown in FIG. 2, a mask layer 2 is formed on the processing workpiece 1 in the mask layer formation step.

The processing workpiece 1 includes a substrate 10, and stacked layers composed of a plurality of first layers 11 and a plurality of second layers 12 stacked alternately on the substrate 10. The processing workpiece 1 may also include an underlaying layer disposed between the substrate 10 and the adjacent first layer 11. The first layers 11 and second layers 12 are an example of a to-be-processed film(s) provided on the substrate 10. The structure of the to-be-processed film(s) is not limited to the structure shown in FIG. 2.

A semiconductor substrate such as a silicon substrate or a silicon carbide substrate, an insulating substrate such as a glass substrate, a quartz substrate or a sapphire substrate, or a compound semiconductor substrate such as a GaAs substrate may be used as the substrate 10.

The first layers 11 are sacrificial layers. A sacrificial layer comprises a region where a conductive layer is to be formed later. Each first layer 11 may be formed by using, for example, a silicon nitride film.

Each second film 12 may be formed by using, for example, a silicon oxide film.

The mask layer 2 includes a first organic material 20 which is reactive with a metal material that is to be introduced into the mask layer 2 in the metallization step. The first organic material 20 is, for example, a spin-on-carbon (SOC) film or a photoresist. The SOC film is a carbon-based film which may be formed by a spin-coating method using a carbon-containing material. The photoresist may be formed of, for example, a resin material.

[Pattern Formation Step]

FIG. 3 is a schematic cross-sectional view illustrating an example of the pattern formation step (S2) and shows part of the processing workpiece 1 in the X-Z cross-section. As shown in FIG. 3, the mask layer 2 is processed to form a mask pattern, including an opening H, in the pattern formation step.

The mask layer 2 may be processed, for example, by a stacked mask process (SMAP). The SMAP includes the steps of: forming an intermediate film 3 as an antireflective film on the mask layer 2; forming a photoresist 4 on the intermediate film 3; processing the photoresist 4 by using a photolithography technique to form a pattern including an opening; etching the intermediate film 3 using the photoresist 4 to transfer the pattern to the intermediate film 3; and processing the mask layer 2 by etching it with the use of the intermediate film 3.

The intermediate film 3 is, for example, a spin-on-glass (SOG) film. The SOG film is a silicon-based film which may be formed by a spin-coating method using a silicon oxide or a silicon-containing material, such as siloxane. The photoresist may be formed of, for example, a resin material. The intermediate film 3 and the photoresist 4 are removed after the processing of the mask layer 2. In other embodiments, the mask layer 2 may be processed by using a method other than SMAP.

[Metallization Step]

The metallization step (S3) is a step for metallizing the mask layer 2. As shown in FIG. 1, an example of the metallization step includes a first metal introduction step (S3-1) and a first oxidation step (S3-2).

First Metal Introduction Step

Figure 4:
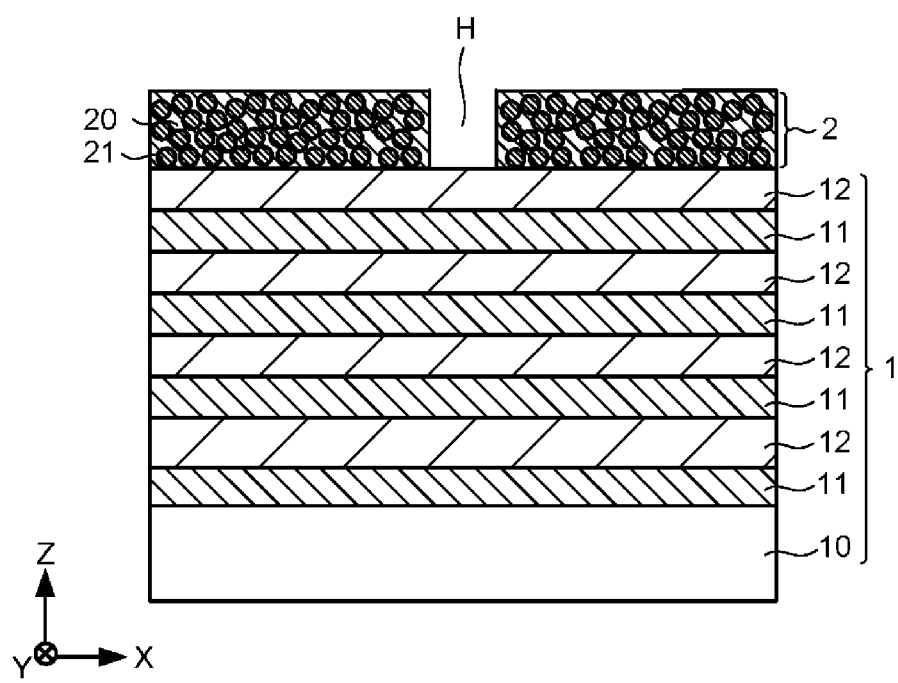
FIG. 4 depicts a mask layer with first metal introduced therein in a schematic cross-sectional view according to an embodiment.

FIG. 4 is a schematic cross-sectional view illustrating an example of the first metal introduction step (S3-1) and shows part of the processing workpiece 1 in the X-Z cross-section. In the first metal introduction step (S3-1), the mask layer 2 is exposed to a first gas containing a first metal material 21, thereby allowing the first metal material 21 to penetrate into the mask layer 2 as shown in FIG. 4. In this context, penetration of a metal material into a layer of another material can also be referred to as impregnation or the like of the metal material into the layer, a metal impregnation process, or the like. The mask layer 2 swells with the penetration of the first metal material 21 into the mask layer 2. The first gas is exhausted after the exposure of the mask layer 2.

The first metal material 21 includes, for example, at least one metal element selected from the group consisting of aluminum, titanium, hafnium, zirconium, and vanadium. The first metal material 21 may be a precursor which can be used, for example, in a chemical vapor deposition (CVD) method or an atomic layer deposition (ALD) method. The precursor may be at least one compound selected from the group consisting of aluminum trichloride ($AlCl_3$), titanium tetrachloride ($TiCl_4$), tungsten hexachloride ($WCl_6$), vanadium tetrachloride ($VCl_4$), hafnium tetrachloride ($HfCl_4$), zirconium tetrachloride ($ZrCl_4$), and trimethylaluminum (TMA). The mask layer 2 may be exposed to a plurality of precursors as will be described later. In that case, precursors which hardly or never react with each other may be used.

First Oxidation Step

Figure 5:
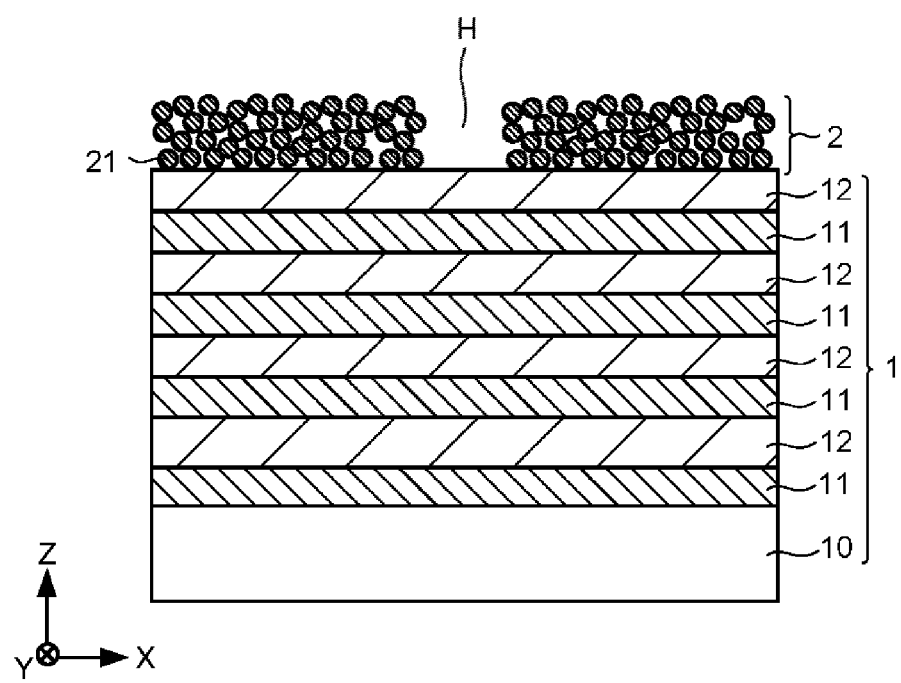
FIG. 5 depicts a mask layer to which first oxidation has been applied in a schematic cross-sectional view according to an embodiment.

FIG. 5 is a schematic cross-sectional view illustrating an example of the first oxidation step (S3-2) and shows part of the processing workpiece 1 in the X-Z cross-section. In the first oxidation step (S3-2), the mask layer 2 is exposed to a first oxidizing gas. The first oxidizing gas is exhausted after the exposure of the mask layer 2.

The first organic material 20 in the mask layer 2 has reaction sites that react with the first metal material 21. By exposing the mask layer 2 to the first oxidizing gas, the first oxidizing gas can oxidize the first metal material 21 and form an oxide of the first metal material 21.

The first oxidizing gas includes, for example, hydrogen peroxide or ozone. Ozone, for example, has a high oxidizing power. Therefore, if the first oxidizing gas includes ozone, the first organic material 20 is removed upon exposure of the mask layer 2 to the first oxidizing gas as shown in FIG. 5. The oxide of the first metal material 21, which remains after the removal of the first organic material 20, is amorphous or crystalline. The removal of the organic material 21 can improve the etching selectivity, the etching resistance, the peeling performance, etc. of the etching mask.

Figure 6:
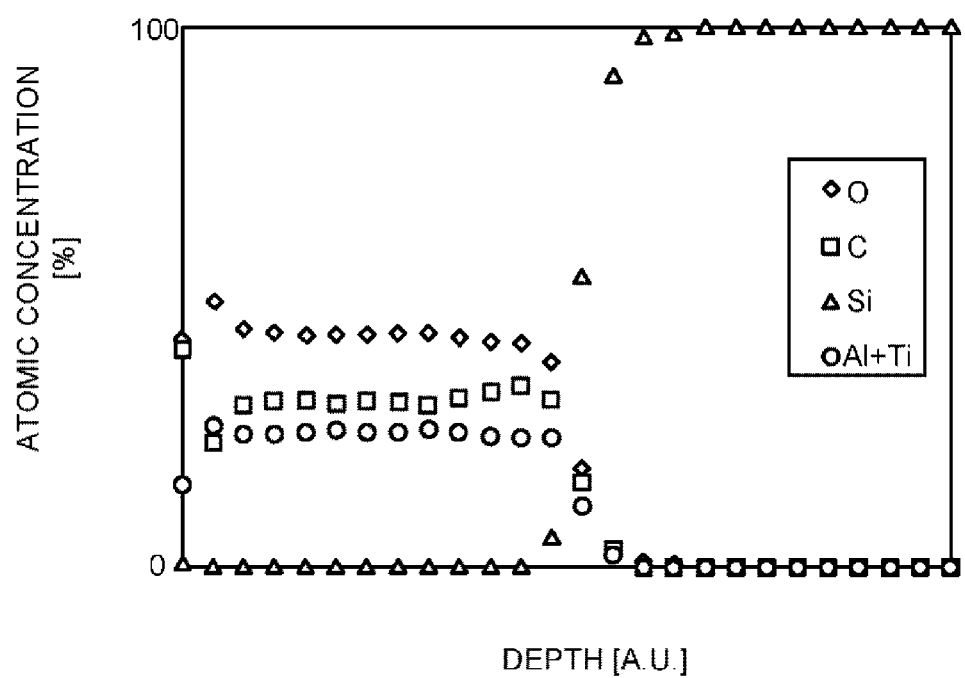
FIG. 6 depicts an example of an XPS depth profile of a mask layer which has been exposed to water according to an embodiment.
Figure 7:
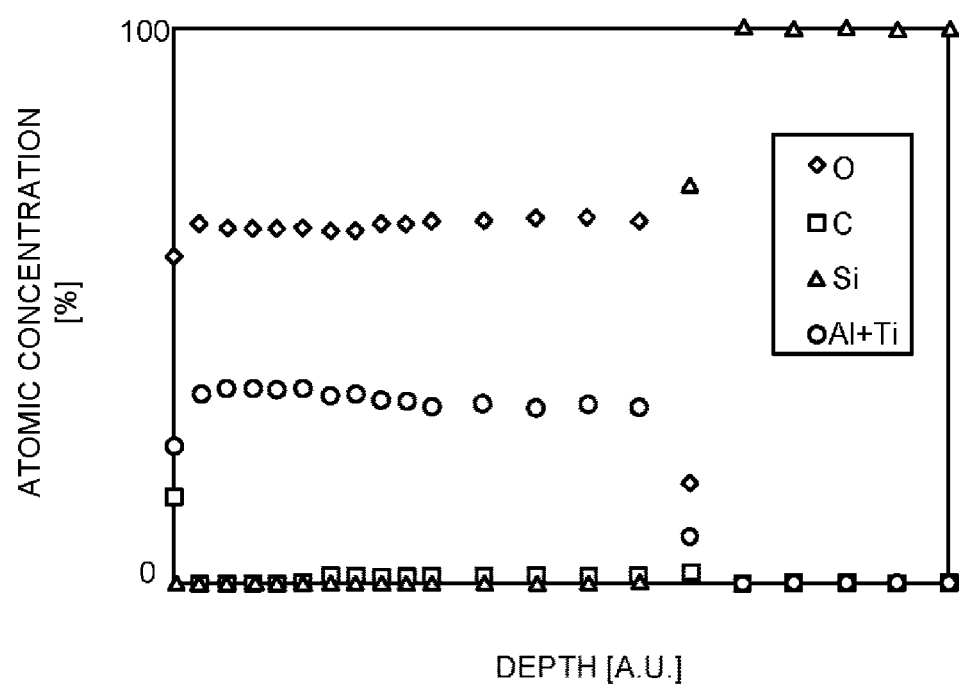
FIG. 7 depicts an example of an XPS depth profile of a mask layer which has been exposed to ozone according to an embodiment.

A difference in the concentration of each element in the mask layer, produced by the use of different oxidizing gases, will now be described. FIG. 6 is a diagram showing an example of an X-ray photoelectron spectroscopy depth profile (XPS depth profile) of an SOC mask layer provided on a silicon substrate and which has been impregnated with metals by using an aluminum-containing precursor and a titanium-containing precursor, and which has been exposed to water. FIG. 7 is a diagram showing an example of an XPS depth profile of an SOC mask layer provided on a silicon substrate and which has been impregnated with metals by using an aluminum-containing precursor and a titanium-containing precursor, and which has been exposed to ozone. FIGS. 6 and 7 each show a relationship between depth in the sample (arbitrary unit) and the concentration of each of oxygen (O), carbon (C), silicon (Si) and the metal elements (Al+Ti).

A region from the surface to the inside of each sample corresponds to the mask layer. The concentration of carbon in the above region as shown in FIG. 7 is lower than the concentration of carbon in the above region as shown in FIG. 6. This indicates that the organic material can be removed by exposing the mask layer to ozone.

According to the present embodiment as described above, a patterned hard mask including a metal or a metal oxide can be formed easily by processing a mask layer including an organic material to form a pattern and then metallizing the mask layer by using a gas having a strong oxidizing power.

In contrast, in the case of first forming a film including a metal or a metal oxide and then forming a pattern, for example, by photolithography, the pattern can only be formed with difficulty because the film including a metal or a metal oxide is hardly etched.

Second Embodiment

Figure 8:
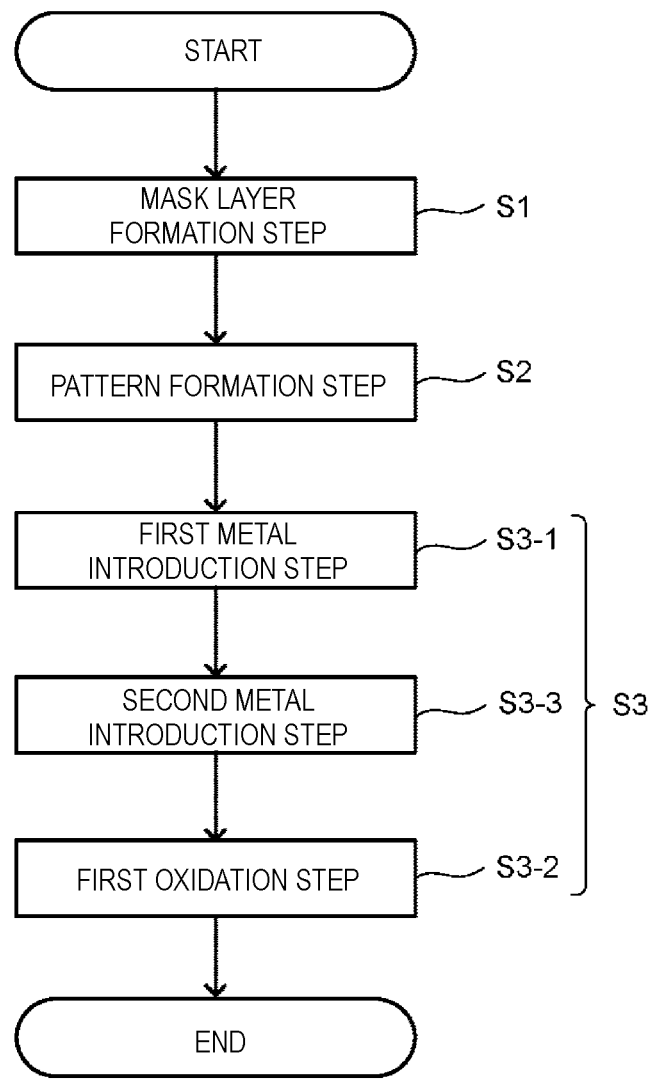
FIG. 8 is a flow chart of a method for forming an etching mask according to an embodiment.

FIG. 8 is a flow chart illustrating an example of an etching mask forming method according to the second embodiment. As shown in FIG. 8, the example of the etching mask forming method includes a mask layer formation step (S1), a pattern formation step (S2) and a metallization step (S3). The metallization step (S3) includes a second metal introduction step (S3-3) between a first metal introduction step (S3-1) and a first oxidation step (S3-2). The mask layer formation step, the pattern formation step and the first metal introduction step are the same as those of the first embodiment, and therefore descriptions thereof will be omitted.

Second Metal Introduction Step

Figure 9:
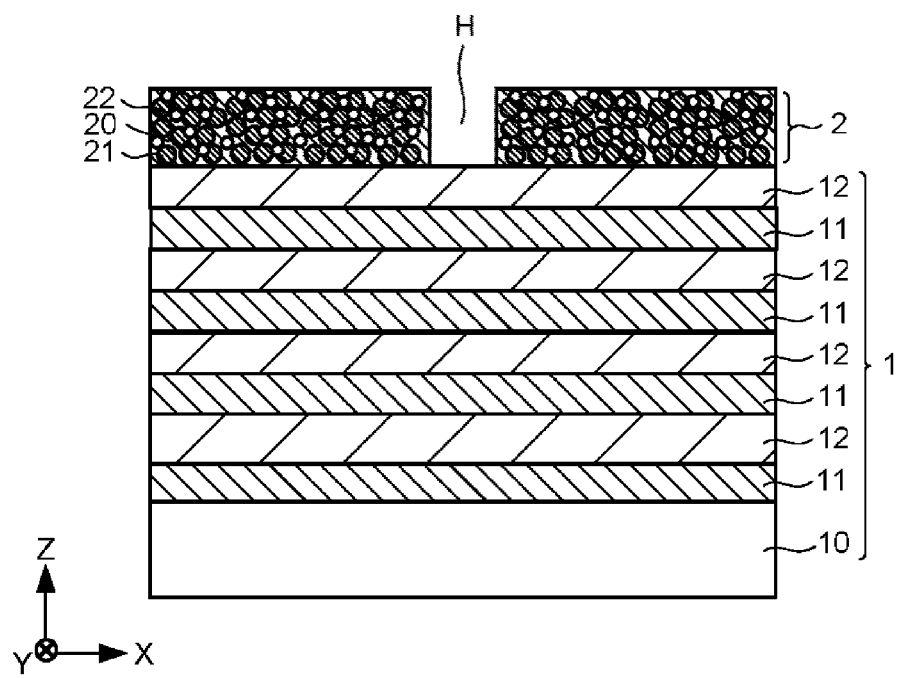
FIG. 9 depicts a mask layer with second metal introduced therein in a schematic cross-sectional view according to an embodiment.

FIG. 9 is a schematic cross-sectional view illustrating an example of the second metal introduction step (S3-3) and shows part of the processing workpiece 1 in the X-Z cross-section. In the second metal introduction step (S3-3), the mask layer 2, impregnated with the first metal material 21, is exposed to a second gas containing a second metal material 22, thereby allowing the second metal material 22 to penetrate into the mask layer 2 as shown in FIG. 9. The mask layer 2 swells by the penetration of the second metal material 22 into the mask layer 2. The second gas is exhausted after the exposure of the mask layer 2.

The second metal material 22 differs from the first metal material 21 and preferably hardly or never reacts with the first metal material 21. The second metal material 22 includes, for example, at least one metal element selected from the group consisting of aluminum, titanium, hafnium, zirconium, and vanadium. The second metal material 22 may be a precursor which can be used, for example, in CVD or ALD. The precursor may be at least one compound selected from the group consisting of aluminum trichloride, titanium tetrachloride, tungsten hexachloride, vanadium tetrachloride, hafnium tetrachloride, zirconium tetrachloride, and trimethylaluminum (TMA).

In the case of using titanium and aluminum as the precursors, for example, aluminum may be allowed to penetrate into the mask layer 2 in the first metal introduction step, and titanium may be allowed to penetrate into the mask layer 2 in the second metal introduction step. If titanium penetrates into the mask layer 2 before aluminum, then the penetration of aluminum may sometimes be hindered by a barrier formed in the mask layer 2.

First Oxidation Step

Figure 10:
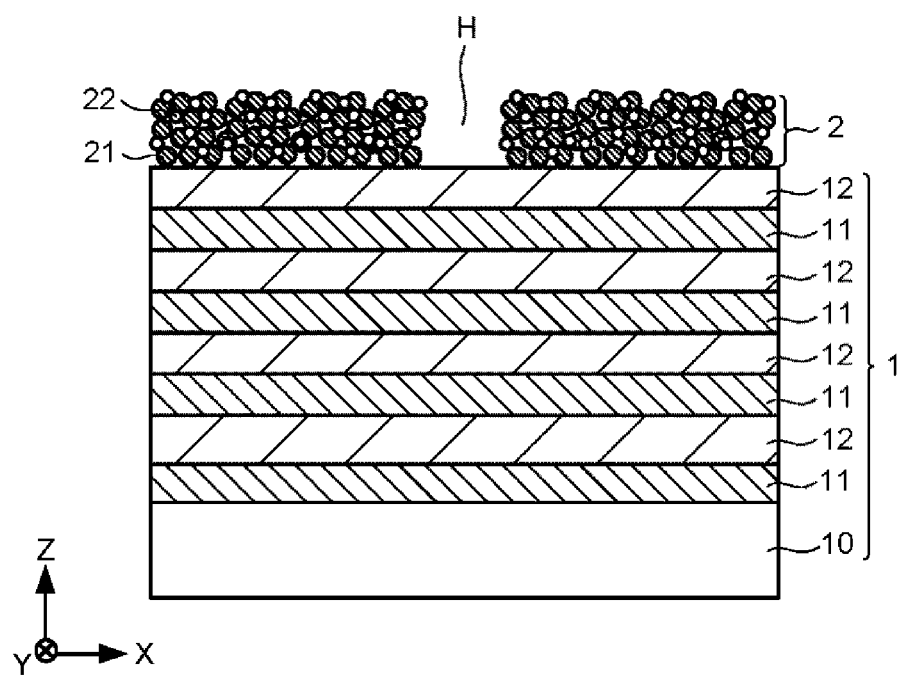
FIG. 10 depicts a mask layer to which first oxidation has been applied in a schematic cross-sectional view according to an embodiment.

FIG. 10 is a schematic cross-sectional view illustrating an example of the first oxidation step (S3-2) and shows part of the processing workpiece 1 in the X-Z cross-section according to the second embodiment. As shown in FIG. 10, in the first oxidation step (S3-2), the mask layer 2 is exposed to the first oxidizing gas as in the first embodiment. The first oxidizing gas is exhausted after the exposure of the mask layer 2.

The first organic material 20 in the mask layer 2 has reaction sites that react with the first metal material 21 and the second metal material 22. By exposing the mask layer 2 to the first oxidizing gas, the first oxidizing gas can oxidize the first metal material 21 and the second metal material 22 and form an oxide of the first metal material 21 and an oxide of the second metal material 22.

If the first oxidizing gas includes ozone, the first organic material 20 is removed upon the exposure of the mask layer 2 to the first oxidizing gas as shown in FIG. 10. This can improve the etching selectivity, the etching resistance, the peeling performance, etc. of the etching mask.

According to the present embodiment, a patterned hard mask can be formed. In addition, the etching selectivity, the etching resistance, the peeling (delamination) performance, etc. of the etching mask can be improved by controlling the compositional ratio between the metal elements in the mask layer. Furthermore, upon etching of the processing workpiece, the etching mask can prevent an oxide of a metal material from scattering and redepositing on the etching surface and thus can prevent undesired inhibition of etching.

Third Embodiment

Figure 11:
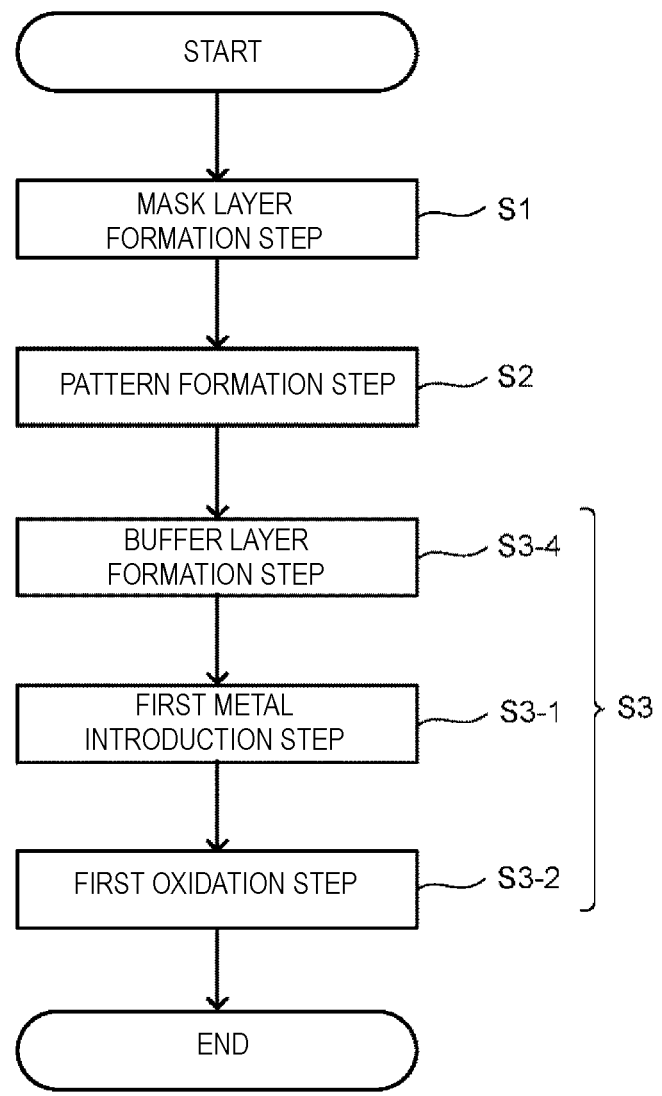
FIG. 11 is a flow chart of a method for forming an etching mask according to an embodiment.

FIG. 11 is a flowchart illustrating an example of an etching mask forming method according to a third embodiment. As shown in FIG. 11, the example of the etching mask forming method includes a mask layer formation step (S1), a pattern formation step (S2) and a metallization step (S3). The metallization step (S3) includes a first metal introduction step (S3-1) and a first oxidation step (S3-2) and further includes a buffer layer formation step (S3-4) between the pattern formation step (S2) and the first metal introduction step (S3-1). The mask layer formation step (S1) and the pattern formation step (S2) are the same as those of the first embodiment, and therefore descriptions thereof will be omitted.

Buffer Layer Formation Step

Figure 12:
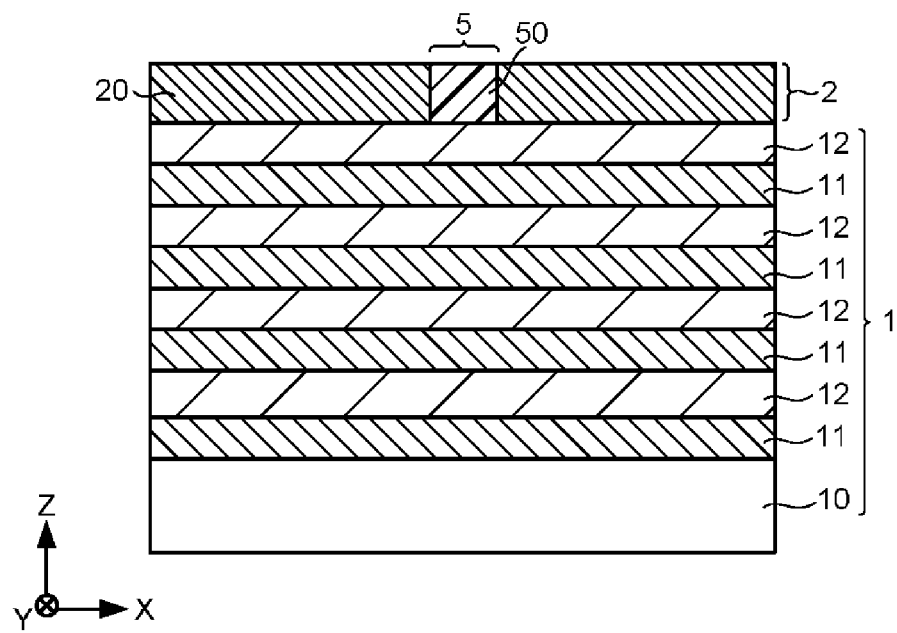
FIG. 12 depicts a mask layer with a buffer layer formed therein in a schematic cross-sectional view according to an embodiment.

FIG. 12 is a schematic cross-sectional view illustrating an example of the buffer layer formation step (S3-4) and shows part of the processing workpiece 1 in the X-Z cross-section. In the buffer layer formation step (S3-4), a buffer layer 5 is formed in the opening H of the pattern.

The buffer layer 5 is a layer having fewer reaction sides than the mask layer 2 or having no reaction sites and includes a second organic material 50 which does not react with the first metal material 21 and the second metal material 22. The buffer layer 5 is, for example, an SOC film.

First Metal Introduction Step

Figure 13:
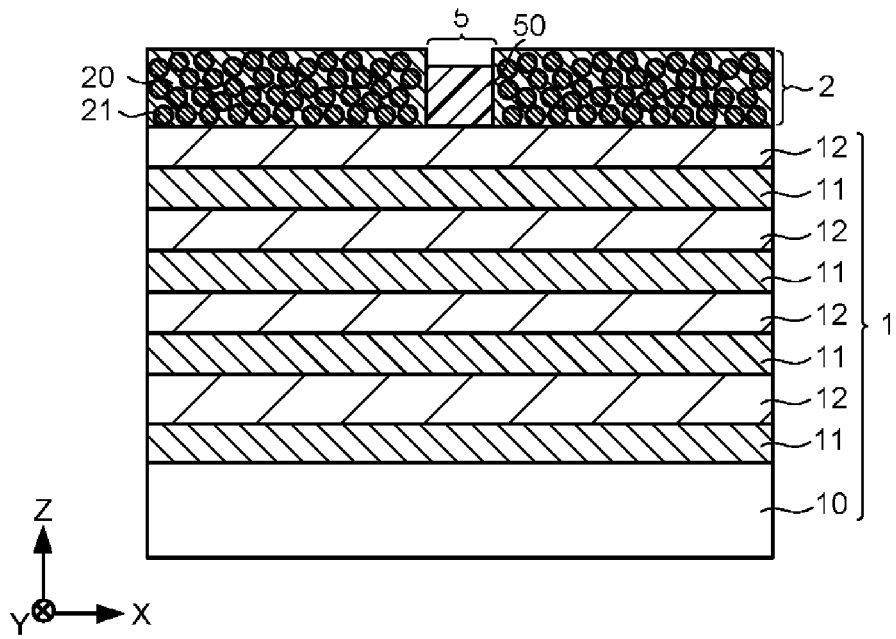
FIG. 13 depicts a mask layer with first metal introduced therein in a schematic cross-sectional view according to an embodiment.

FIG. 13 is a schematic cross-sectional view illustrating an example of the first metal introduction step (S3-1) and shows part of the processing workpiece 1 in the X-Z cross-section according to the third embodiment. In the first metal introduction step (S3-1), the mask layer 2 is exposed to the first gas as in the first embodiment, thereby allowing the first metal material 21 to penetrate into the mask layer 2. The first gas is exhausted after the exposure of the mask layer 2.

The mask layer 2 swells by the penetration of the first metal material 21 into the mask layer 2. On the other hand, the first gas passes through the buffer layer 5 without remaining therein because the buffer layer 5 has few or no reaction sites. Therefore, the buffer layer 5 does not swell. This makes it possible to prevent deformation of the pattern upon the swelling of the mask layer 2.

First Oxidation Step

Figure 14:
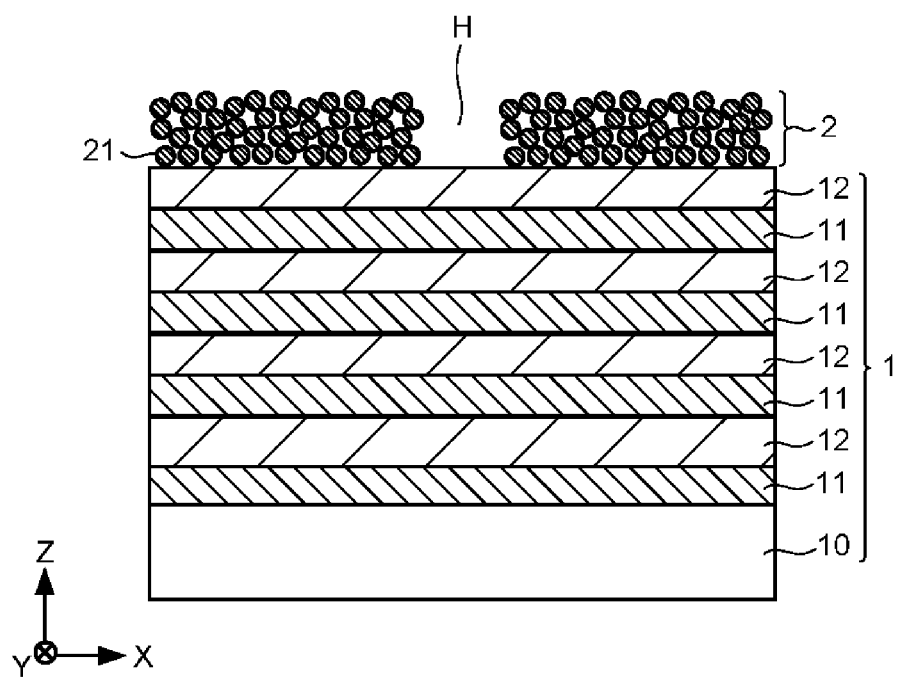
FIG. 14 depicts a mask layer to which first oxidation has been applied in a schematic cross-sectional view according to an embodiment.

FIG. 14 is a schematic cross-sectional view illustrating an example of the first oxidation step (S3-2) and shows part of the processing workpiece 1 in the X-Z cross-section according to the third embodiment. In the first oxidation step (S3-2), the mask layer 2 is exposed to the first oxidizing gas as in the first embodiment. The first oxidizing gas can oxidize the first metal material 21 and form an oxide of the first metal material 21. The oxide of the first metal material 21 is amorphous or crystalline. The first oxidizing gas is exhausted after the exposure of the mask layer 2.

If the first oxidizing gas includes ozone, the first organic material 20 and the buffer layer 5 are removed upon exposure of the mask layer 2 to the first oxidizing gas as shown in FIG. 14.

According to the present embodiment as described above, a patterned hard mask can be formed with relative ease. In addition, the formation of the buffer layer can prevent deformation of the pattern upon the swelling of the mask layer. This can enhance the dimensional accuracy of the hard mask.

The present embodiment may be appropriately combined with one or more other embodiments. For example, a second metal introduction step (S3-3) may be performed as in the second embodiment.

Fourth Embodiment

Figure 15:
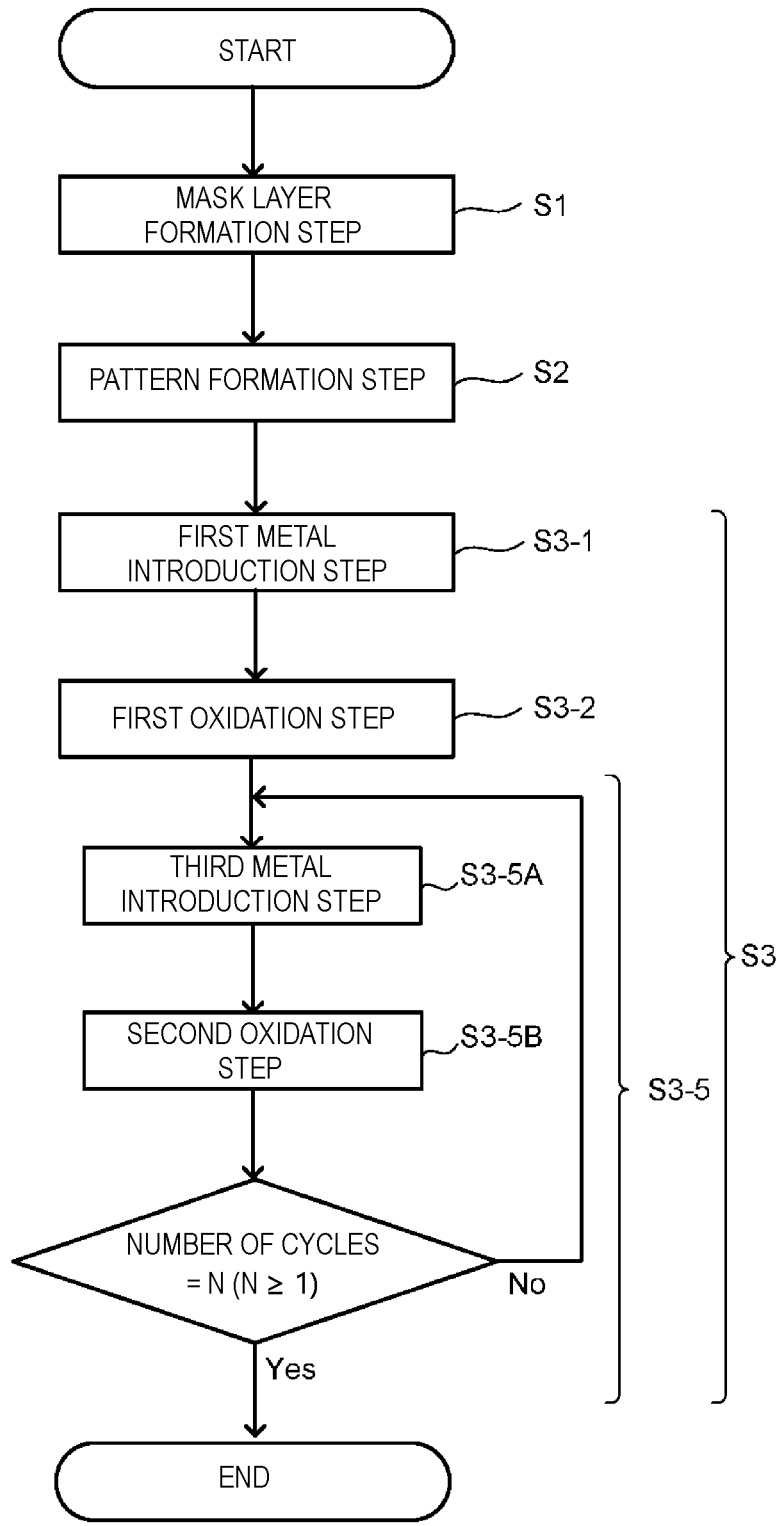
FIG. 15 is a flow chart of a method for forming an etching mask according to an embodiment.

FIG. 15 is a flowchart illustrating an example of an etching mask forming method according to a fourth embodiment. As shown in FIG. 15, the example of the etching mask forming method according to the fourth embodiment includes a mask layer formation step (S1), a pattern formation step (S2) and a metallization step (S3). The metallization step (S3) includes a first metal introduction step (S3-1) and a first oxidation step (S3-2) and further includes cycling steps (S3-5) after the first oxidation step (S3-2). The mask layer formation step (S1), the pattern formation step (S2), the first metal introduction step (S3-1), and the first oxidation step (S3-2) are the same as those of the first embodiment, and therefore descriptions thereof will be omitted.

Cycling Steps

In the cycling steps (S3-5), a third metal introduction step (S3-5A) and a second oxidation step (S3-5B) are repeated, until the number of cycles reaches N (N is a natural number not less than 1) for example. The number of cycles may be appropriately set depending on the parameters required for the etching mask.

Figure 16:
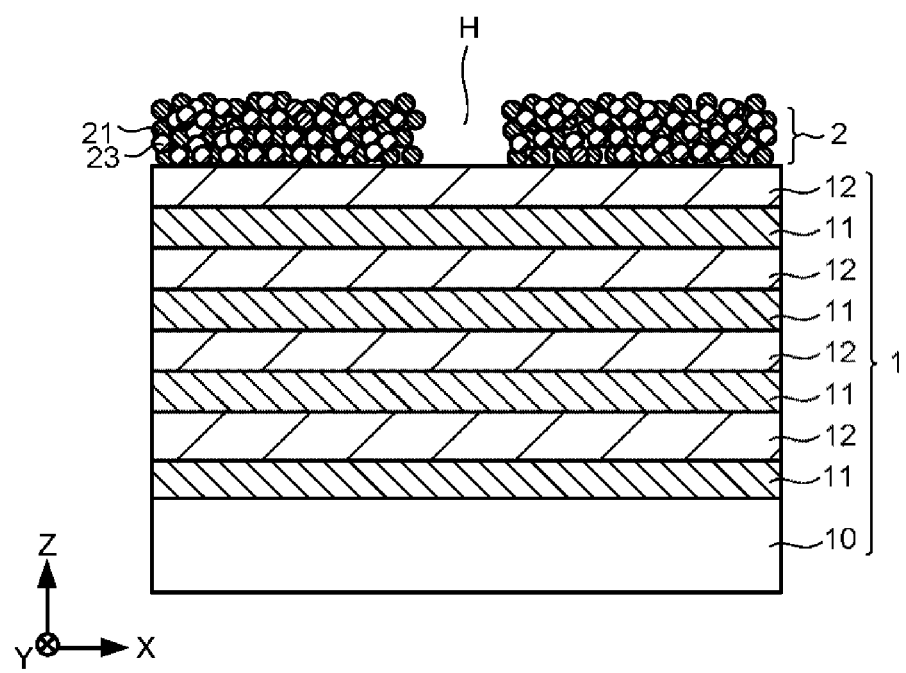
FIG. 16 depicts a mask layer to which cycling steps have been applied.

FIG. 16 is a schematic cross-sectional view illustrating an example of the cycling steps and shows part of the processing workpiece 1 in the X-Z cross-section according to the fourth embodiment. In the third metal introduction step (S3-5A), the mask layer 2 is exposed to a third gas containing a third metal material 23, thereby introducing the third metal material 23 into the mask layer 2. After evacuation of the third gas, the mask layer 2 is exposed to a second oxidizing gas including hydrogen peroxide or ozone in the second oxidation step (S3-5B). The second oxidizing gas is exhausted (or evacuated) after the exposure of the mask layer 2.

The third metal material 23 reacts with the second oxidizing gas. Thus, the second oxidizing gas can oxidize the third metal material 23 and form an oxide of the third metal material 23. This can increase the density of the mask layer 2.

The third metal material 23 may be the same as or different from the first metal material 21. The type of a metal material that can penetrate into the mask layer 2 including the first organic material 20 depends on the reaction sites. In contrast, in the case where the first organic material 20 is removed in the first oxidation step (S3-2) as in the first embodiment, the type of the third metal material 23 has no such dependency. Thus, a material different from the first metal material 21 and the second metal material 22 can be used as the third metal material 23.

The third metal material 23 includes, for example, at least one metal element selected from the group consisting of aluminum, tantalum, niobium, hafnium, zirconium, vanadium, titanium, dysprosium, lanthanum, praseodymium, scandium, yttrium, ytterbium, strontium, bismuth, ruthenium, and zinc.

The third metal material 23 may be a precursor which can be used, for example, in CVD or ALD. The precursor may be at least one compound selected from the group consisting of tris(1-methyl-2-methyl-2-propoxy)aluminum (Al(MMP)$_3$), trimethylaluminum (TMA), tert-butylimido-tris(diethylamido)tantalum (t-BuN=Ta(NEt$_2$)$_3$), tert-butylimido-tris(ethylmethylamido)tantalum (t-BuN=Ta(NEtMe)$_3$), tert-butylimido-tris(diethylamido)niobium (t-BuN=Nb(NEt$_2$)$_3$), tert-butylimido-tris(ethylmethylamido)niobium (t-BuN=Nb(NEtMe)$_3$), tetrakis(1-methyl-2-methyl-2-propoxy)hafnium (Hf(MMP)$_4$), tetrakis(tert-butoxy)hafnium (Hf(OtBu)$_4$), tetrakis(dimethylamido)hafnium (Hf(NMe$_2$)$_4$), Zr(MMP)$_4$, tetrakis(tert-butoxy)zirconium (Zr(OtBu)$_4$), tetrakisethylmethylamido zirconium (Zr(NEtMe)$_4$), tetrakis(1-methyl-2-methyl-2-propoxy)titanium (Ti(MMP)$_4$), tetrakis(tert-butoxy)titanium (Ti(OtBu)$_4$), tetrakisethylmethylamido titanium (Ti(NEtMe)$_4$), tris(6-ethyl-2,2-dimethyl-3,5-decanedionato)dysprosium (Dy(EDMDD)$_3$), tris(s-butylcyclopentadienyl)dysprosium (Dy(s-BuCp)$_3$), tris(6-ethyl-2,2-dimethyl-3,5-decanedionato)lanthanum (La(EDMDD)$_3$), tris(s-butylcyclopentadienyl)lanthanum (La(s-BuCp)$_3$), tris(6-ethyl-2,2-dimethyl-3,5-decanedionato)praseodymium (Pr(EDMDD)$_3$), tris(s-butylcyclopentadienyl)praseodymium (Pr(s-BuCp)$_3$), tris(6-ethyl-2,2-dimethyl-3,5-decanedionato)scandium (Sc(EDMDD)$_3$), tris(s-butylcyclopentadienyl)scandium (Sc(s-BuCp)$_3$), tris(6-ethyl-2,2-dimethyl-3,5-decanedionato)yttrium (Y(EDMDD)$_3$), tris(s-butylcyclopentadienyl)yttrium (Y(s-BuCp)$_3$), tris(6-ethyl-2,2-dimethyl-3,5-decanedionato)ytterbium (Yb(EDMDD)$_3$), methylethyltetramethyl-3,5-heptanedionato)strontium (Sr(METHD)$_2$). 2-methyl-2,4-pentanedioxy-bis(2,2,6,6-tetramethyl-2,5-heptanedionato)titanium (Ti(MPD)(THD)$_2$), tetrakis(1-methyl-2-methyl-2-propoxy)bismuth (Bi(MMP)$_4$), tantalum tetrachloride (TaCl$_4$), tetrakis(dimethylamido)titanium (Ti(NMe$_2$)$_4$) tris(octanedionato)ruthenium (Ru(OD)$_3$), bis(ethylcyclopentadienyl)ruthenium (Ru(EtCp)$_2$), bis(6-ethyl-2,2-dimethyl-3,5-decanedionato)zinc (Zn(EDMDD)$_2$), bis(octanedionato)zinc (Zn(OD)$_2$), aluminum trichloride, titanium tetrachloride, tungsten hexachloride, vanadium tetrachloride, hafnium tetrachloride, and zirconium tetrachloride. When a plurality of precursors are used, it is preferred that the precursors do not significantly react with each other.

The amount of a metal material that can penetrate into the mask layer 2 including the first organic material 20 depends on the available reaction sites. In contrast, in the case where the first organic material 20 is removed in the first oxidation step as in the first embodiment, the amount of the third metal material 23 does not have such dependency. When trimethylaluminum (TMA) (a metal precursor) penetrates into the mask layer 2, an amorphous structure composed of Al$_x$O$_y$ remains after the first oxidation step. The Al$_x$O$_y$ structure may have Al—OH terminal groups. Therefore, an ALD reaction can be started with "—OH" (available hydroxyl groups) in the second oxidation step.

The type of the third metal material 23 and the type of the second oxidizing gas may be changed for each cycle repetition. This makes it possible to control the compositional ratio between the metal elements in the mask layer 2, thereby adjusting the etching selectivity, the etching resistance, the peeling (delamination) performance, etc. of the mask layer 2. Further, upon etching of the processing workpiece 1, the etching mask thus formed can prevent an oxide of a metal material from scattering and redepositing on the etching surface and thus can prevent undesired inhibition of etching in unmasked regions or the like. When the number of cycles is equal to or more than 2 (N≥2), the cycle steps may include a second oxidation step(s) using water as a second oxidizing gas if the cycle steps also include a second oxidation step(s) using hydrogen peroxide or ozone as a second oxidizing gas.

As described above, according to the present embodiment, the density of the mask layer 2 can be increased by repeating the third metal introduction step (S3-5A) and the second oxidation step (S3-5B). This makes it possible to increase the etching resistance, especially the resistance to reactive ion etching (RIE). When forming, for example, a pattern having a high aspect ratio, the etching mask is exposed to an etching gas for a long time; therefore, the etching mask may have a high etching resistance.

The present embodiment can be appropriately combined with one or more other embodiments. For example, a second metal introduction step (S3-3) as performed in the second embodiment may be performed before the cycle steps (S3-5). A buffer layer formation step (S3-4) as performed in the third embodiment may be performed between the pattern formation step (S2) and the first metal introduction step (S3-1).

Fifth Embodiment

Figure 17:
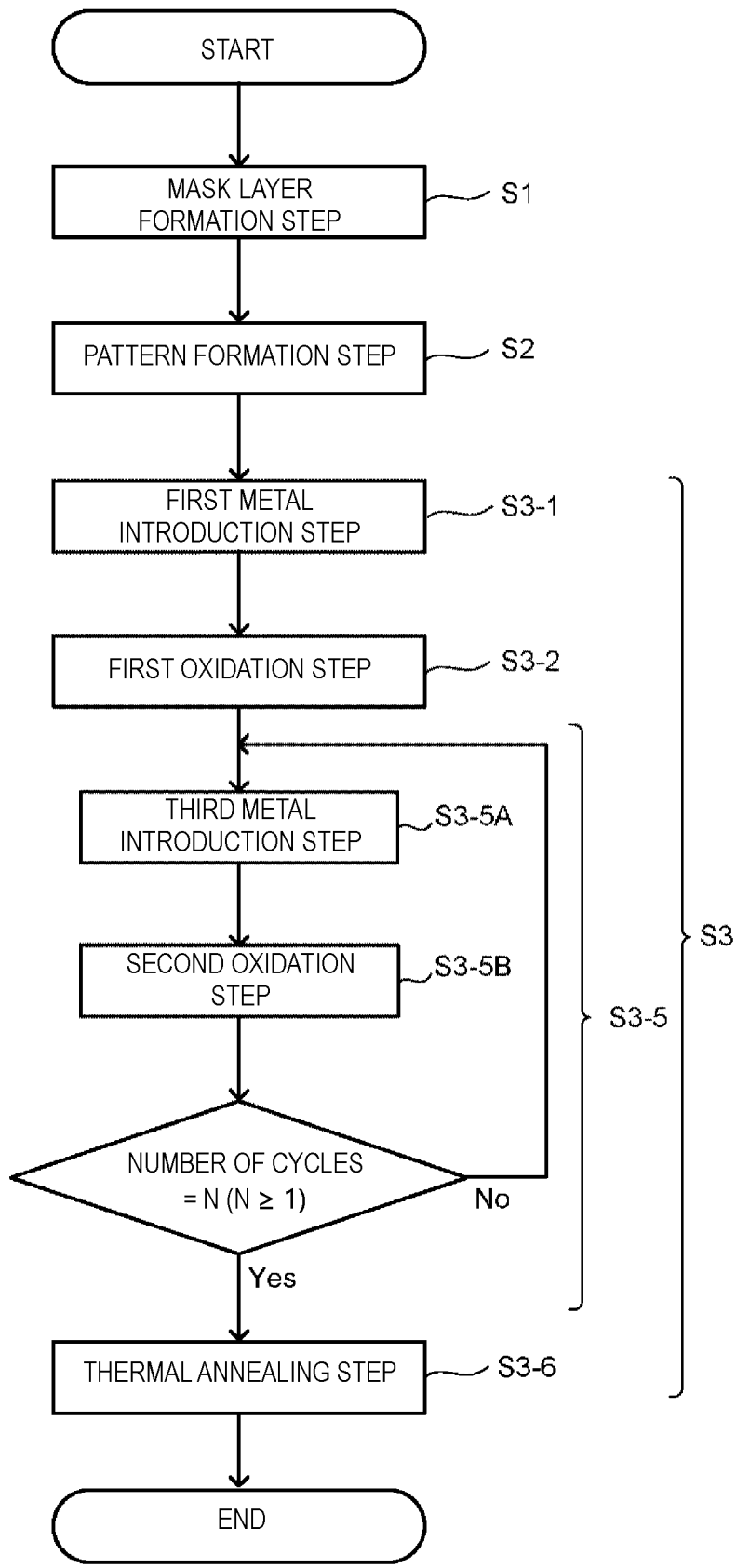
FIG. 17 is a flow chart of a method for forming an etching mask according to an embodiment.

FIG. 17 is a flowchart illustrating an example of an etching mask forming method according to a fifth embodiment. As shown in FIG. 17, the example of the etching mask forming method according to the fifth embodiment includes a mask layer formation step (S1), a pattern formation step (S2) and a metallization step (S3). The metallization step (S3) includes a first metal introduction step (S3-1), a first oxidation step (S3-2) and cycle steps (S3-5), and further includes a thermal annealing step (S3-6) after the cycle steps (S3-5). The mask layer formation step (S1), the pattern formation step (S2), the first metal introduction step (S3-1), and the first oxidation step (S3-2) are the same as those of the first embodiment, and the cycle steps (S3-5) are the same as those of the fourth embodiment, and therefore descriptions thereof will be omitted.

Thermal Annealing Step

In the thermal annealing step (S3-6), the mask layer 2 is annealed to promote crystallization of an oxide of a metal material in the mask layer 2. A preferable annealing temperature is, for example, not less than the crystallization temperature of an oxide of a metal material introduced in the mask layer 2. Thus, the annealing temperature may be set appropriately depending on the type(s) of the metal material(s) used.

By promoting the crystallization of an oxide of a metal material in the mask layer 2 according to the present embodiment, the etching resistance, especially the RIE resistance, of the etching mask can be increased. When forming, for example, a pattern having a high aspect ratio, the etching mask is exposed to an etching gas for a long time; therefore, the etching mask may have a high etching resistance.

The present embodiment can be appropriately combined with one or more other embodiments. For example, a second metal introduction step (S3-3) as performed in the second embodiment may be performed before the cycle steps (S30-5) and the thermal annealing step (S3-6). A buffer layer formation step (S3-4) as performed in the third embodiment may be performed between the pattern formation step (S2) and the first metal introduction step (S3-1).

Sixth Embodiment

Figure 18:
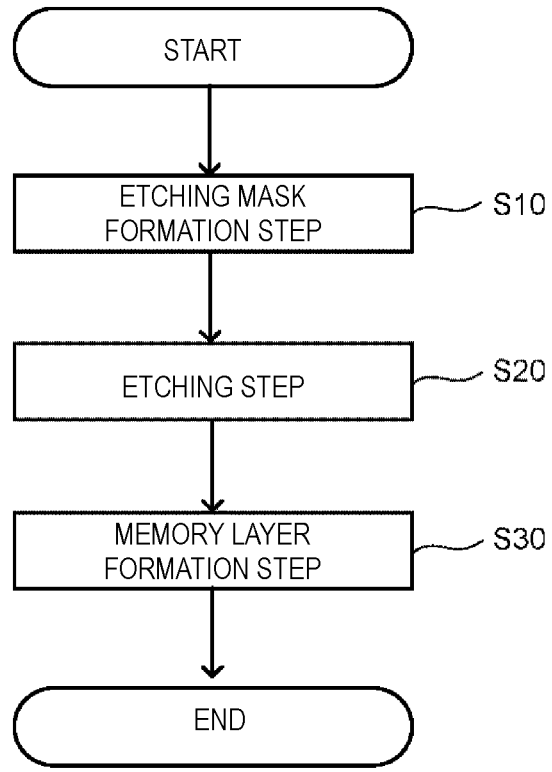
FIG. 18 is a flow chart of a method for manufacturing a semiconductor device according to an embodiment.

FIG. 18 is a flow chart illustrating an example of a semiconductor device manufacturing method according to a sixth embodiment. As shown in FIG. 18, the example of the semiconductor device manufacturing method according to the sixth embodiments includes an etching mask formation step (S10), an etching step (S20) and a memory layer formation step (S30).

[Etching Mask Formation Step]

Figure 19:
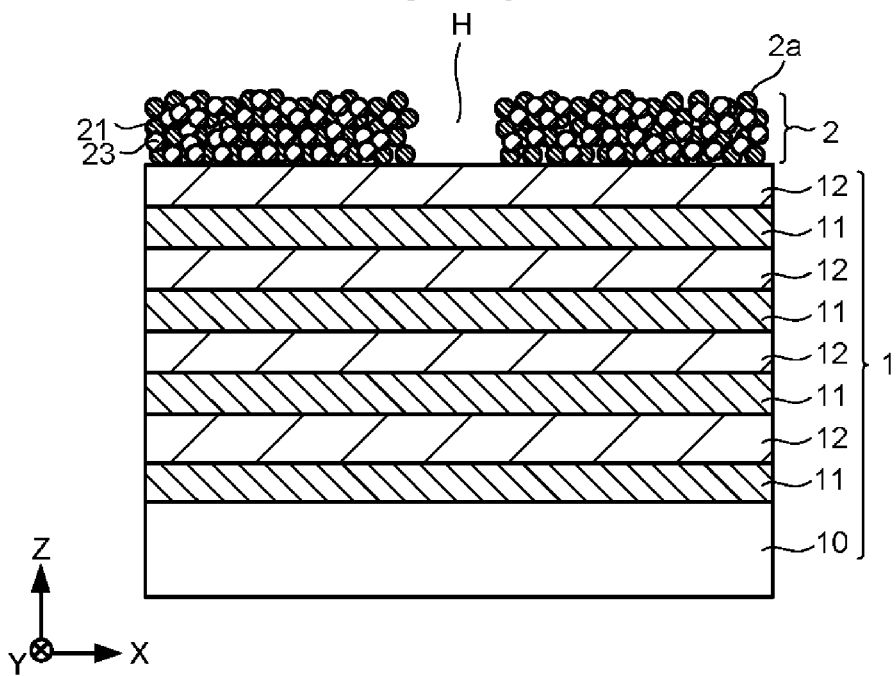
FIG. 19 depicts a mask layer formed on an object in a schematic cross-sectional view according to an embodiment.

FIG. 19 is a schematic cross-sectional view illustrating an example of the etching mask formation step and shows part of the processing workpiece 1 in the X-Z cross-section. In the etching mask formation step (S10), an etching mask 2a composed of a metallized mask layer 2 is formed on the processing workpiece 1. The etching mask 2a is a hard mask and has a pattern including an opening H. While FIG. 19 shows the etching mask 2a formed by the method of the fifth embodiment, the etching mask 2a may be formed by any of the etching mask forming methods according to the first to fifth embodiments.

[Etching Step]

Figure 20:
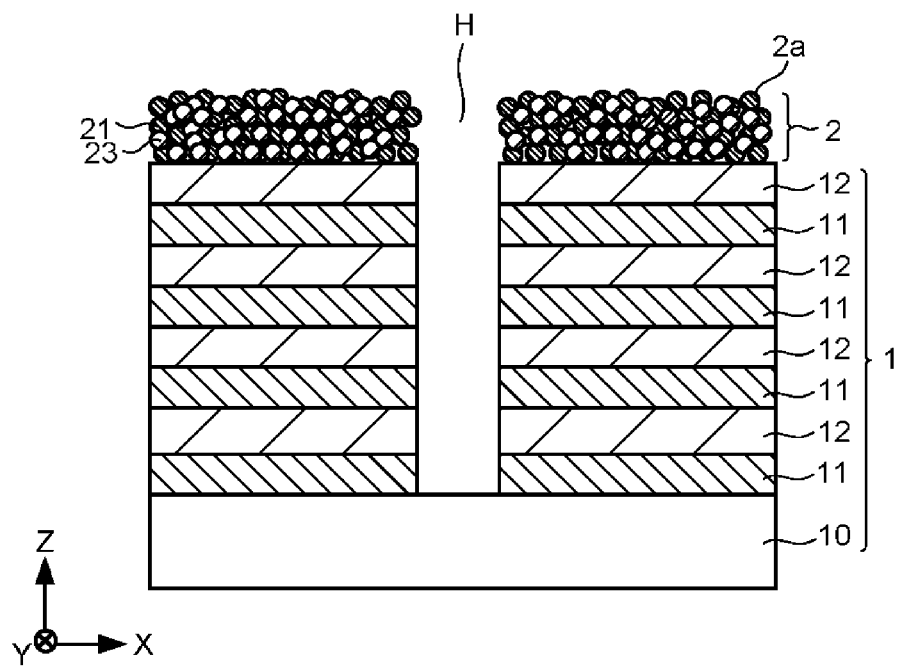
FIG. 20 depicts a mask pattern etched in a mask layer and an object in a schematic cross-sectional view according to an embodiment.

FIG. 20 is a schematic cross-sectional view illustrating an example of the etching step and shows part of the processing workpiece 1 in the X-Z cross-section. In the etching step (S20), the processing workpiece 1 is etched using the etching mask 2a. The processing workpiece 1 can be etched, for example, by RIE. The etching mask 2a is removed after the etching.

[Memory Layer Formation Step]

Figure 21:
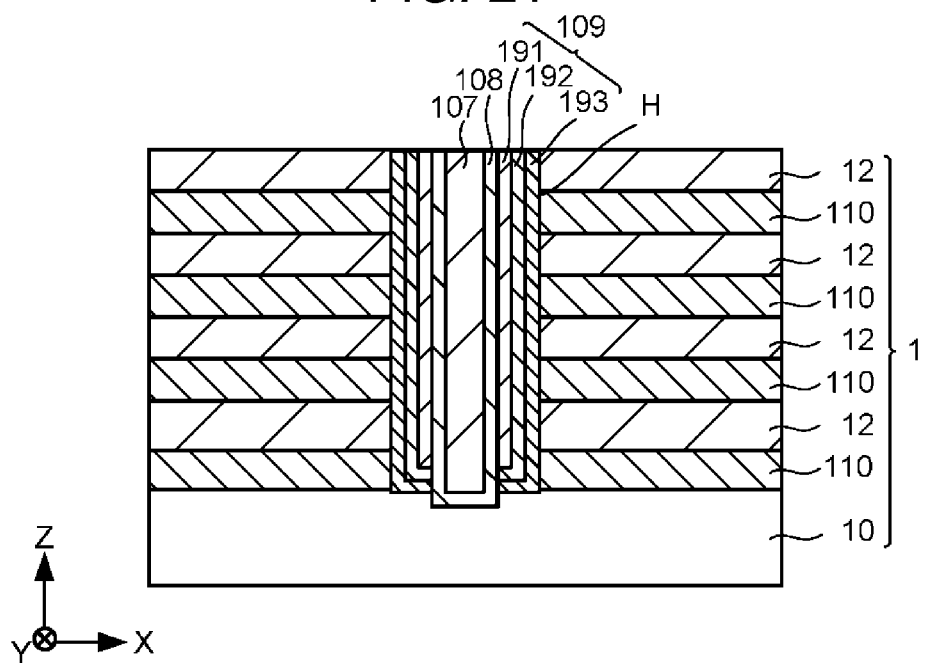
FIG. 21 depicts a memory layer formed in a mask layer and an object in a schematic cross-sectional view according to an embodiment.

FIG. 21 is a schematic cross-sectional view illustrating an example of the memory layer formation step and shows part of the processing workpiece 1 in the X-Z cross-section. In the memory layer formation step (S30), a memory film 109, including a block insulating film 193, a charge storage layer 192 and a tunnel insulating film 191, a semiconductor channel layer 108, and a core insulating film 107 are formed in this order in the opening H. The core insulating film 107, the semiconductor channel layer 108 and the memory film 109 function as memory layers constituting a memory cell.

A silicon oxide film, for example, may be used as the core insulating film 107. A polysilicon layer, for example, may be used as the semiconductor channel layer 108. A stacked film including a silicon oxide film and a silicon oxynitride film, for example, may be used as the tunnel insulating film 191. A silicon nitride film, for example, may be used as the charge storage layer 192. A silicon oxide film, for example, may be used as the block insulating film 193.

After the formation of the memory film 109, the first layers 11 are removed to form cavities between the second layers 12, and conductive films are embedded into the cavities to form conductive layers 110. The conductive layers 110 function, for example, as gate electrodes (word lines). Further, a contact plug, interconnects, an interlayer insulating film, etc. are formed on the substrate 10. A semiconductor device can be manufactured in this manner.

As described above, in the present embodiment, a hard mask having a pattern including an opening is formed by a method according to any one of the above-described embodiments, and a processing workpiece can be etched using the hard mask thus formed. The methods of the present disclosure the processing object/workpiece to be etched even when forming an etched pattern having a high aspect ratio.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for forming an etching mask, comprising:
    forming a mask layer comprising a first organic material on a workpiece;
    processing the mask layer to form a pattern including an opening;
    exposing the mask layer to a first gas including a first metal material such that the first metal material penetrates into the mask layer, the first metal material including a first metal; and
    exposing the mask layer to a first oxidizing gas comprising hydrogen peroxide or ozone to oxidize the first metal material and lower the concentration of carbon atoms in the mask layer to less than the concentration of first metal atoms in the mask layer.

2. The method according to claim 1, wherein the first organic material is a photoresist.

3. The method according to claim 1, wherein the first metal material comprises at least one metal element selected from the group consisting of aluminum, titanium, hafnium, zirconium, and vanadium.

4. The method according to claim 1, wherein
    the first oxidizing gas comprises ozone, and
    the first organic material is substantially removed from the mask layer by the exposure of the mask layer to the first oxidizing gas.

5. The method according to claim 1, further comprising:
    exposing the mask layer to a second gas containing a second metal material different from the first metal material so that the second metal material penetrates into the mask layer, wherein
    the second metal material is oxidized by the exposure of the mask layer to the first oxidizing gas.

6. The method according to claim 5, wherein exposing the mask layer to the second gas is performed after the exposure of the mask layer to the first gas.

7. The method according to claim 5, wherein the second metal material comprises at least one metal element selected from the group consisting of aluminum, titanium, hafnium, zirconium, and vanadium.

8. The method according to claim 1, further comprising:
    exposing the mask layer to a third gas containing a second metal material; and
    exposing the mask layer to a second oxidizing gas comprising water, hydrogen peroxide or ozone, wherein
    exposing the mask layer to the third gas and exposing the mask layer to the second oxidizing gas are performed repeatedly in alternation after exposing the mask layer to the first oxidizing gas.

9. The method according to claim 8, wherein the second metal material comprises at least one metal element selected from the group consisting of aluminum, tantalum, niobium, hafnium, zirconium, vanadium, titanium, dysprosium, lanthanum, praseodymium, scandium, yttrium, ytterbium, strontium, bismuth, ruthenium, and zinc.

10. The method according to claim 1, further comprising:
    forming a buffer layer in the opening of the pattern, the buffer layer comprising a second organic material that does not react with the first metal material.

11. The method according to claim 10, wherein the second organic material is a carbon-based film.

12. The method according to claim 1, further comprising:
    annealing the mask layer to promote crystallization of an oxide of the first metal material after exposing the mask layer to the first oxidizing gas.

13. A method for manufacturing a semiconductor device, comprising:
    forming an etching mask on a workpiece; and
    etching the workpiece using the etching mask, wherein
    forming the etching mask on the workpiece comprises:
        forming a mask layer comprising a first organic material on the workpiece;
        processing the mask layer to form a pattern including an opening;
        exposing the mask layer to a first gas containing a first metal material such that the first metal material penetrates into the mask layer, the first metal material including a first metal; and
        exposing the mask layer to a first oxidizing gas comprising hydrogen peroxide or ozone to oxidize the first metal material and lower the concentration of carbon atoms in the mask layer to less than the concentration of first metal atoms in the mask layer.

14. The method according to claim 13, wherein
    forming the etching mask further comprises:
        exposing the mask layer to a second gas containing a second metal material different from the first metal material so that the second metal material penetrates into the mask layer, and
        the second metal material is oxidized by the exposure of the mask layer to the first oxidizing gas.

15. The method according to claim 13, wherein
    forming the etching mask further comprises:
        exposing the mask layer to a third gas containing a third metal material; and
        exposing the mask layer to a second oxidizing gas comprising water, hydrogen peroxide, or ozone, and
        exposing the mask layer to the third gas and exposing the mask layer to the second oxidizing gas are repeatedly performed in alternation after exposing the mask layer to the first oxidizing gas.

16. The method according to claim 15, wherein
    a cycle of exposing the mask layer to the third gas and exposing the mask layer to the second oxidizing gas is repeated for a predetermined number of cycles, and
    a type of the third metal of the third gas and a type of the second oxidizing gas are changed for each cycle.

17. The method according to claim 13, wherein forming the etching mask further comprises:
    forming a buffer layer in the opening of the pattern, the buffer layer comprising a second organic material that does not react with the first metal material.

18. The method according to claim 13, wherein forming the etching mask further comprises:
    annealing the mask layer to promote crystallization of an oxide of the first metal material after the exposing the mask layer to the first oxidizing gas.

19. A method of forming an etching mask, comprising:
    forming a mask layer comprising a first organic material on an object;

forming an opening in the mask layer;

applying a first gas including a first metal material to the mask layer, the first metal material including a first metal;

applying a first oxidizing gas to the mask layer to oxidize the first metal and lower the concentration of carbon atoms in the mask layer to less than the concentration of first metal atoms in the mask layer, the first oxidizing gas comprising hydrogen peroxide or ozone; and repeatedly performing a cycle of applying a third gas to the mask layer and applying a second oxidizing gas to the mask layer, the third gas comprising a third metal material and the second oxidizing gas comprising water, hydrogen peroxide or ozone.

20. The method according to claim 19, wherein the object is a semiconductor substrate.

\* \* \* \* \*